United States Patent
Regev et al.

(10) Patent No.: US 6,922,751 B2
(45) Date of Patent: Jul. 26, 2005

(54) READING OR WRITING WHILE SEARCHING IN A CAM

(75) Inventors: Alon Regev, Woodland Hills, CA (US); Zvi Regev, West Hills, CA (US)

(73) Assignee: Micron Technology, Inc., Boise, ID (US)

(*) Notice: Subject to any disclaimer, the term of this patent is extended or adjusted under 35 U.S.C. 154(b) by 287 days.

(21) Appl. No.: 10/320,490

(22) Filed: Dec. 17, 2002

(65) Prior Publication Data

US 2004/0117544 A1 Jun. 17, 2004

(51) Int. Cl.⁷ .............................................. G06F 12/00
(52) U.S. Cl. .................... 711/108; 365/189.04; 365/49
(58) Field of Search .......................... 711/108; 710/244; 365/49, 203

(56) References Cited

U.S. PATENT DOCUMENTS 5,964,857 A * 10/1999 Srinivasan et al. ......... 710/244
6,707,693 B1 * 3/2004 Ichiriu .......................... 365/49

OTHER PUBLICATIONS

Zukowski, C. A, and Wang, S. Use of Selective Precharge for Low–Power on the Match Lines of Content–Addressable Memories. Proceedings., International Workshop on Memory Technology, Design and Testing, Aug. 11–12, 1997. pp. 64–68.*

Ron White. How Computers Work. 2004, Que Publishing, 7th ed., pp. 49–51.*

* cited by examiner

Primary Examiner—Donald Sparks
(74) Attorney, Agent, or Firm—Dickstein Shapiro Morin & Oshinsky

(57) ABSTRACT

The present invention provides a content addressable memory (CAM) match search circuit that permits searching of the search circuit while accessing for reading from, writing to, or refreshing a match detection circuit within the search circuit. In accordance with an exemplary embodiment of the invention, rather than allowing the allowing the search circuit to search a match detection circuit being accessed, the match detection circuit is isolated and forced to indicate a mismatch. Furthermore, the contents of the match detection circuit are stored separately and subsequently searched.

94 Claims, 10 Drawing Sheets

READING OR WRITING WHILE SEARCHING IN A CAM

FIELD OF THE INVENTION

The present invention relates generally to semiconductor memory, and more particularly to a match detection circuit and search circuit for a content addressable memory.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has a pair of status bits that keep track of whether the location is storing valid information in it or is empty and available for writing.

Once information is stored in a memory location, it is found by comparing every bit in memory with data in the comparand register. When the content stored in the CAM memory location does not match the data in the comparand register, the local match detection circuit returns a no match indication. When the content stored in the CAM memory location matches the data in the comparand register, a local match detection circuit returns a match indication. If one or more local match detect circuits return a match indication, the CAM device returns a "match" indication. Otherwise, the CAM device returns a "no-match" indication. In addition, the CAM may return the identification of the address location in which the matched data is stored or one of such addresses if more than one address contained matching data. Thus, with a CAM, the user supplies the data and gets back the address if there is a match found in memory.

Locally, CAMs may perform match detection using an exclusive-NOR (XNOR) function, so that a match is indicated only if both the stored bit and the corresponding input bit are the same state. CAMs are designed so that any number of stored bits may be simultaneously detected for a match with the input bits in the match detection circuit. One way in which this is achieved is by coupling a plurality of storage devices and logic circuits to a common Match line, as depicted in FIG. 1.

Turning to FIG. 1, a schematic diagram of a conventional match detection circuit 100 is depicted. A first source/drain terminal of a p-type pre-charge transistor 102 is coupled to a positive voltage source (e.g., VDD). The gate of transistor 102 is coupled to a signal line 138 for receiving a Pre-charge signal. A second source/drain terminal of transistor 102 is coupled to a Match line 140 for pre-charging the Match line 140 to a predetermined voltage level (e.g., VDD).

Respective outputs $Q_0$, $Q_1$, $Q_{n-1}$ of storage elements 104, 114, 124, which are to be respectively compared with the input bits $B_0$, $B_1$, $B_{n-1}$ are respectively coupled to gates of n-type transistors 106, 116 and 126. First respective source/drain terminals of transistors 106, 116 and 126 are coupled to the Match line 140.

Second respective source/drain terminals of transistors 106, 116 and 126 are respectively coupled to n-type transistors 110, 120 and 130. Second respective source/drain terminals of transistors 110, 120 and 130 are coupled to ground. The gates of transistors 110, 120 and 130 are respectively coupled to complements $B_0'$, $B_1'$ and $B_{n-1}'$ of the respective input bits.

Further, the respective complements of the outputs $Q_0'$, $Q_1'$ and $Q_{n-1}'$ of the storage elements 104, 114 and 124 are respectively coupled to gates of n-type transistors 108, 118 and 128. First respective source/drain terminals of transistors 108, 118 and 128 are coupled to the Match line 140. Second source/drain terminals of transistors 108, 118 and 128 are respectively coupled to first source/drain terminals of n-type transistors 112, 122 and 132. Second respective source/drain terminals of transistors 112, 122 and 132 are coupled to ground. The gates of transistors 112, 122 and 132 are respectively coupled to the input bits $B_0$, $B_1$ and $B_{n-1}$ to be respectively compared with the complements $Q_0'$, $Q_1'$ and $Q_{n-1}'$ of the stored bits being stored in storage elements 104, 114 and 124.

Input bits $B_0$, $B_1$, and $B_{n-1}$ used to store information in the storage elements are also respectively coupled to first respective source/drain terminals of n-type transistors 162, 172, and 182. Second respective source/drain terminals of transistors 162, 172, and 182 are coupled to respective inputs of storage elements 104, 114, and 124. The gates of transistors 162, 172, and 182 are coupled to a word select line 190. The complement of input bits $B_0'$, $B_1'$, and $B_{n-1}'$ used to store information in the storage elements are respectively coupled to first respective source/drain terminals of n-type transistors 164, 174, and 184. Second respective source/drain terminals of transistors 164, 174, and 184 are coupled to respective inputs of storage elements 164, 174, and 184. The gates of transistors 164, 174, and 184 are coupled to a word select line 190.

Also coupled to the Match line 140 is a buffer 136 for buffering the Match line 140 voltage and for outputting the Match signal. A Match signal of logic HIGH (e.g., VDD) represents that an exact match was detected between the input bits $B_0$, $B_1$, $B_{n-1}$ and the stored bits $Q_0$, $Q_1$, $Q_{n-1}$. A Match signal of logic LOW (e.g., Ground) represents that at least one bit of the stored bits did not match its corresponding input bit causing the Match line to be pulled to Ground. Capacitor 134 represents the parasitic capacitance of the Match line 140 that is pre-charged to the initial predetermined value (e.g., VDD).

To write to or to read from storage elements 104, 114, and 124, a word select signal is enabled Logic HIGH then Logic LOW which temporarily closes transistors 162, 164, 172, 174, 182, and 184 and couples the storage elements 104, 114, and 124 to their respective input bits $B_0$, $B_1$, and $B_{n-1}$ and the respective complement of input bits $B_0'$, $B_1'$, and $B_{n-1}'$.

During operation of the FIG. 1 match detection circuit 100, the Pre-charge signal goes logic LOW then logic HIGH in order to pre-charge the Match line 140 to VDD. The state of the stored bits $Q_0$, $Q_1$, $Q_{n-1}$ stored by the respective storage elements 104, 114, 124 and their complements $Q_0'$, $Q_1'$, $Q_{n-1}'$ are respectively coupled to the gates of n-type transistors 106, 116, 126, 108, 118, 128. Consequently, depending upon the states at their respective gates, the transistors 106, 116, 126, 108, 118, 128 may become active and conduct.

Similarly, the state of the input bits $B_0$, $B_1$, $B_{n-1}$ and their complements $B_0'$, $B_1'$, $B_{n-1}'$ are coupled to the gates of n-type transistors 112, 122, 132, 110, 120, 130. Consequently, depending upon the states at their respective gates, the transistors 112, 122, 132, 110, 120, 130 may become active and conduct. Consequently, input bits $B_0$, $B_1$, $B_{n-1}$ and their complements $B_0'$, $B_1'$, $B_{n-1}'$ serve in more than one capacity: they function to read and write information to the storage elements 104, 114, and 124 and they also function to carry the information stored in the comparand for comparison with information stored in the storage elements 104, 114, and 124.

When a match is detected, at least one transistor of each serially connected pair of transistors (e.g., 106 and 110, 108 and 112, etc.) is inactive and not conducting. Therefore, when the Match line 140 remains logic HIGH, this signifies to the outside world that a match has been detected and potentially enables any other functions desired when a match is detected (e.g., provide the user with the address of the memory location where the match was found, forward the data to another location, etc.).

However, when a mismatch is detected, as is most often the case during a search for a particular bit pattern, at least one pair of serially connected transistors (e.g., 106, 108, 110, and 112) is active and conducting and the Match line 140 is coupled to Ground. When the Match line 140 is coupled to Ground, the Match signal goes logic LOW and signifies to the outside world that a mismatch has been detected in this particular series of storage elements 104, 114, 124. Although match circuit 100 is shown with three storage elements 104, 114 and 124, any number of storage elements may be utilized.

In the above-identified search process, the searched data (i.e., the input bits from the comparand) present on the respective bit lines is simultaneously compared with every data word in the CAM 100 in order to find a match between the stored data and the input data. As seen in FIG. 2, a CAM search circuit 200 for use during a write operation is shown, which includes the CAM bank 210. A CAM bank 210 includes a plurality of match detection circuits 100 (FIG. 1). A database (not shown) which supplies the data words to be stored in storage elements 104, 114, and 124 (FIG. 1) of each match detection circuit 100 is coupled to the CAM bank 210.

FIG. 3 shows a CAM search circuit 201 for using in CAM during a read operation. The search circuit 201 encompasses the circuits used in search circuit 200 for using in CAM during a write operation (FIG. 2) and includes additional elements enabling a read access operation to a match detection circuit 100. As seen in FIG. 3, an address generator 218 is coupled to the CAM bank 210 which supplies the address corresponding to a respective data word. A comparand data register 202 which stores the information sought to be compared is coupled to CAM bank 210. The CAM bank 210 is also coupled to data read register 212 which is used to store data read from the CAM bank. The CAM bank 210 is also coupled to a priority encoder 214. The CAM search circuit 201 outputs the address of the word in the CAM bank 210 that matches the comparand. In a CAM bank 210 however, more than a single word may match the comparand, but the CAM search circuit 201 may need to indicate the address of only one of the matching words.

The priority encoder 214 is used in the CAM search circuit 201 as the means to translate the position of a matching word from match detection circuit 100, into a numerical address representing the location of that word. Typically, the priority encounter returns the higher priority address (e.g., the smaller address). The priority encoder 214 is typically also used to only translate the location of one word, and ignore all other simultaneously matching words. A typical priority encoder 214 is comprised of two blocks. The first block is called the "highest priority indicator," and is followed by the "address encoder" block. In the initial state all the inputs are at a state of logic HIGH which is the inactive state, while all the outputs are in the inactive state of logic LOW. Whenever any input goes to the active state of logic LOW, the output associated with this input becomes active as well, and goes to the state of logic HIGH. Consequently, an active input also disables all the inputs above it in the chain, forcing their associated outputs to remain inactive (e.g., logic LOW). The bottom of the priority encoder has the highest priority, and the priority descends toward the top. Therefore, if any number of inputs are simultaneously active, the highest priority indicator will activate only the output associated with the highest priority active input, leaving all other outputs inactive, thus indicating the highest priority activity. Many methods are use to convert the output of the highest priority indicator into a numerical value. The simplest method is that of a look-up table. Depending on the implementation, different implementations can be used for determining priority can be implemented, e.g., a lowest priority address may be desired. The output of the priority encoder 214 is coupled to a register 216 which coupled to a downstream circuit.

Because of the architecture of the CAM search circuit 200 and the corresponding architecture of a match detection circuit 100, it is possible that a read or write to storage elements of the CAM within a match detection circuit 100 during an on going search operation will cause an erroneous match between the comparand and a stored word. One approach to solving this problem is to suspend a search operation while reading or writing to a match detection circuit 100. This approach is not highly desirable because it would lead to significant decreases in search processing time.

Therefore, it is desirable to be able to read and write to a CAM match detection circuit without suspending a search and without causing an erroneous search result.

BRIEF SUMMARY OF THE INVENTION

The present invention provides a CAM match detection circuit that is excluded from a search operation while a corresponding data location is written to, read from, or being refreshed. In accordance with an exemplary embodiment of the invention, rather than allowing the CAM match detection circuit to be searched during a read or write operation, the CAM match detection circuit will output a signal indicating that a mismatch is found. The invention provides that the match line will be coupled to Vss (e.g., Ground) during a read or writing operation therefore indicating a mismatch is found. The invention also provides a data buffer to store information read from a match detection circuit to compare to the comparand.

These and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 4:
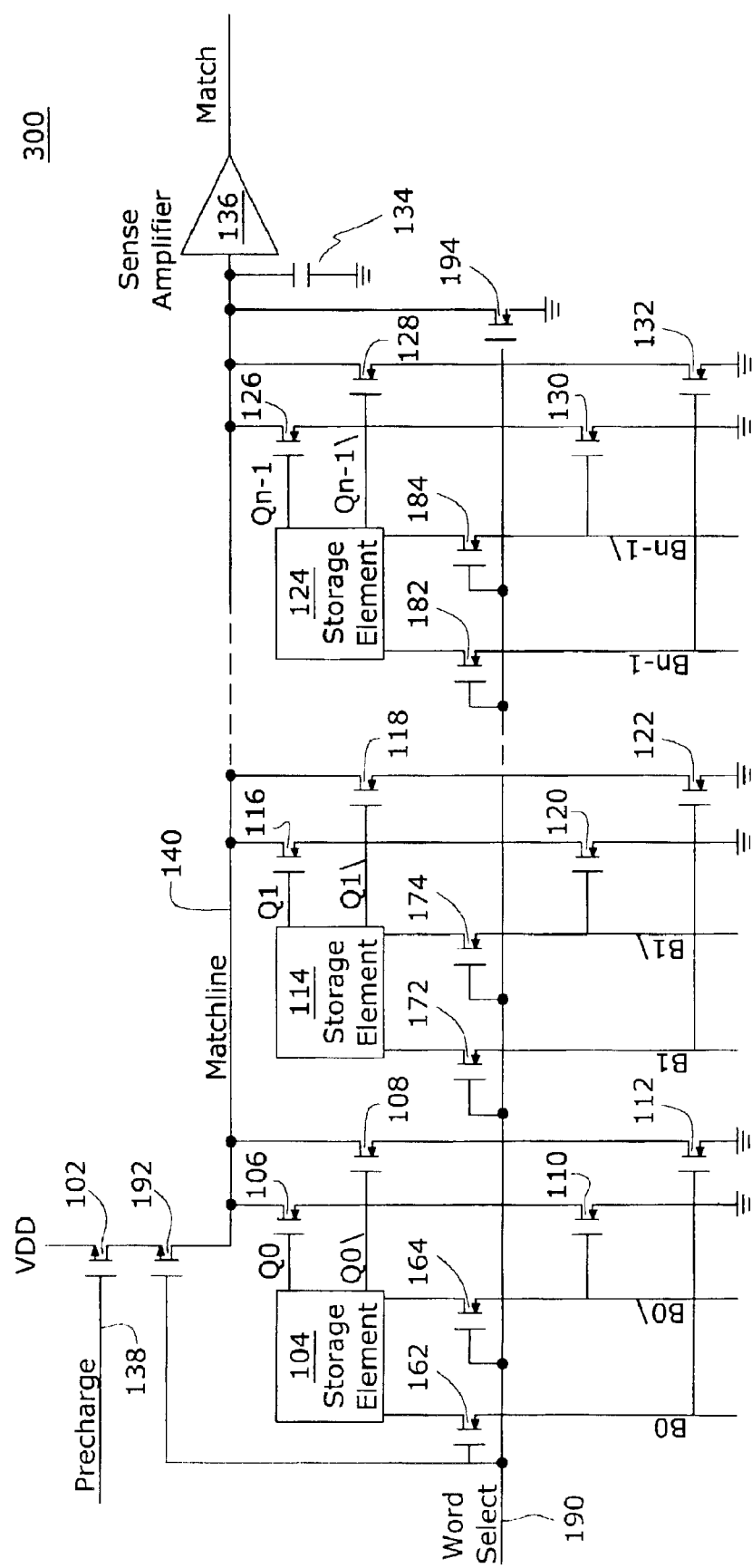
FIG. 4 is a schematic diagram of a CAM match detection circuit for use during a write or read operation in a SRAM in accordance with an exemplary embodiment of the invention.

FIG. 4 depicts a simplified schematic diagram of a CAM match detection circuit 300, in accordance with an exemplary embodiment of the invention. The storage elements 104, 114, and 124 may be any complementary storage element, e.g., a static flip-flop storage element, known in the art that provides a logic state of the stored value and its complementary logic state (e.g., Q0 and Q0').

Figure 1:
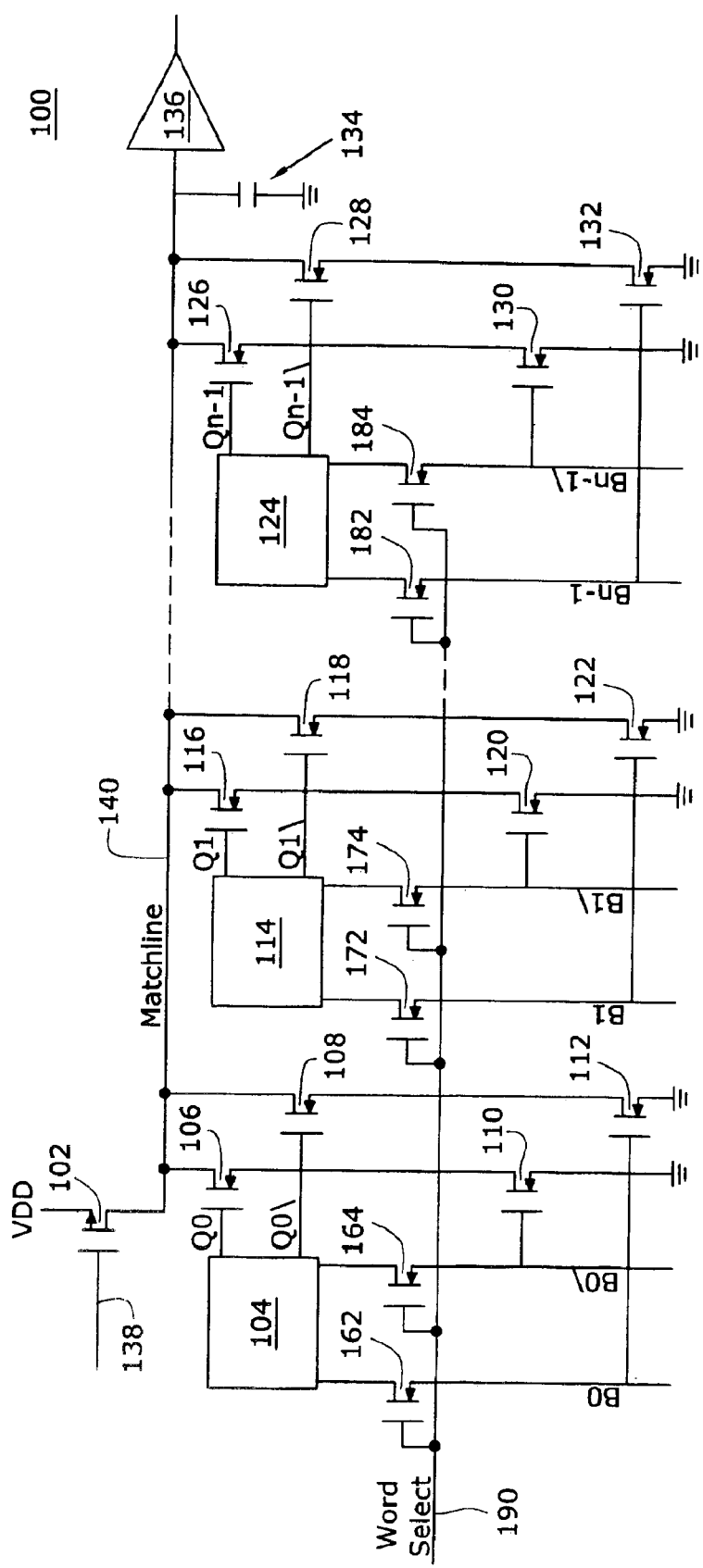
FIG. 1 is a schematic diagram of a CAM match detection circuit in the prior art.

The configuration of the FIG. 4 match detection circuit 300 differs from that of the FIG. 1 match detection circuit 100 in several respects, one being that the second source/drain terminal of transistor 102 is coupled to the match line 140 through a p-type transistor 192. The gate of transistor 192 is coupled to the word select line 190. When the word select line 190 is enabled to read or write from the CAM detection circuit 300 (e.g., logic HIGH) the match line 140 is further isolated from the pre-charge voltage VDD. When the word select line 190 is not enabled (e.g., logic LOW) the match line 140 is coupled to the second source/drain gate of transistor 102 permitting the match line 140 to be coupled to the pre-charge voltage VDD.

Circuit 300 also differs from circuit 100 in that the match line is coupled to Vss (e.g., Ground) through an n-type transistor 194. The gate of transistor 192 is coupled to the word select line 190. Consequently, when the word select line 190 is enabled to read or write from the CAM detection circuit 300 (e.g., logic HIGH) the match line 140 is pulled down to Vss indicating a 'no match.' In CAM searches, it is preferable to return a 'no match' to an 'erroneous match.'

Figure 2:
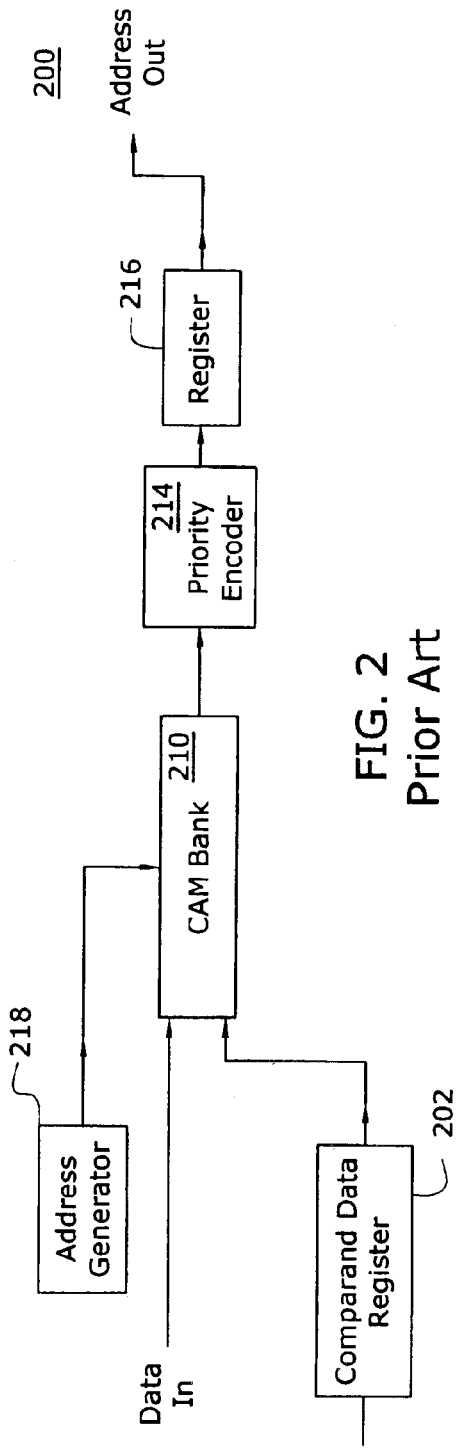
FIG. 2 is a schematic diagram of a CAM search circuit for use in a write operation in the prior art.
Figure 5:
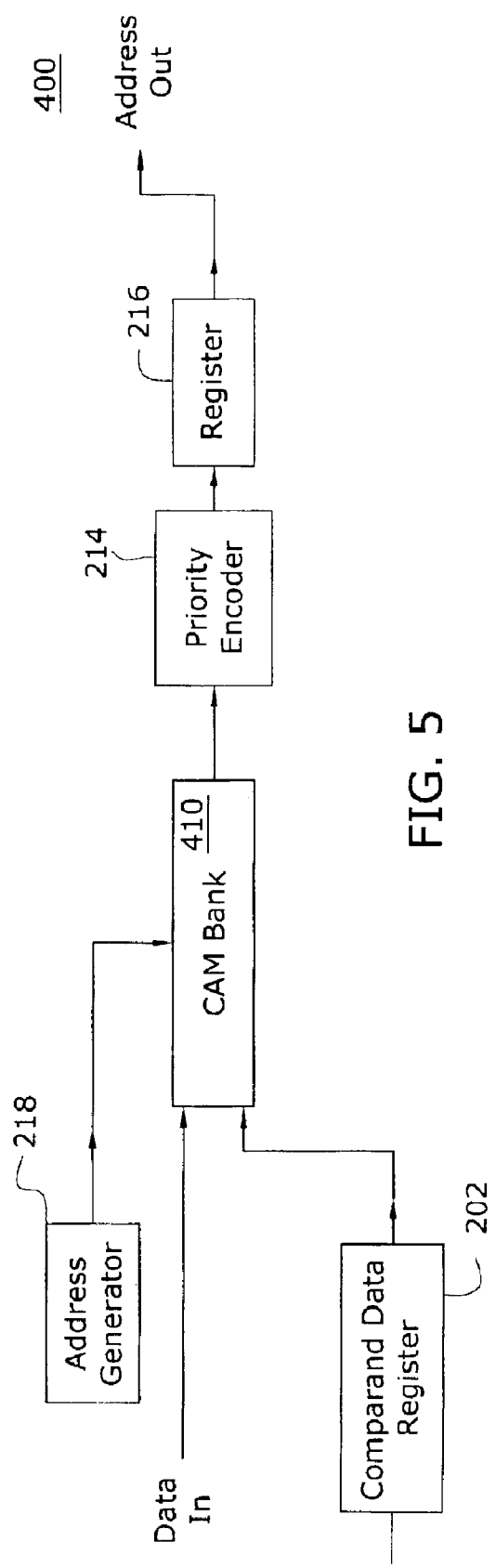
FIG. 5 is a schematic diagram of a CAM search circuit for use in a SRAM during a memory write operation in accordance with an exemplary embodiment of the invention.

FIG. 5 depicts a simplified schematic diagram of a CAM search circuit 400 which incorporates the match detection circuit 300 for use during the implementation of a write operation to a match detection circuit 300 during a search of CAM search circuit 400, in accordance with an exemplary embodiment of the invention. The configuration of the FIG. 5 search circuit 400 differs from the FIG. 2 search circuit 200 in that the CAM bank 410 incorporates match detection circuits 300 in place of match detection circuits 100.

Therefore, during a write operation using the circuit 400, word select line 190 corresponding to the match detection circuit 300 to be written to is enabled thereby pulling the match line 140 to VSS. The word to be written to the match detection circuit 300 may then be transferred to the match detection circuit 300 in the CAM bank 410 without interrupting any search operation of the CAM bank 410. Furthermore, the search operation of the CAM bank 410 need not be delayed or incorporate any clock cycle offset to write to the match detection circuit 300 while the search is proceeding. By isolating the match detection circuit 300 and indicating a 'mismatch,' the match detection circuit 300 does not falsely enable a signal indicating a match.

Figure 3:
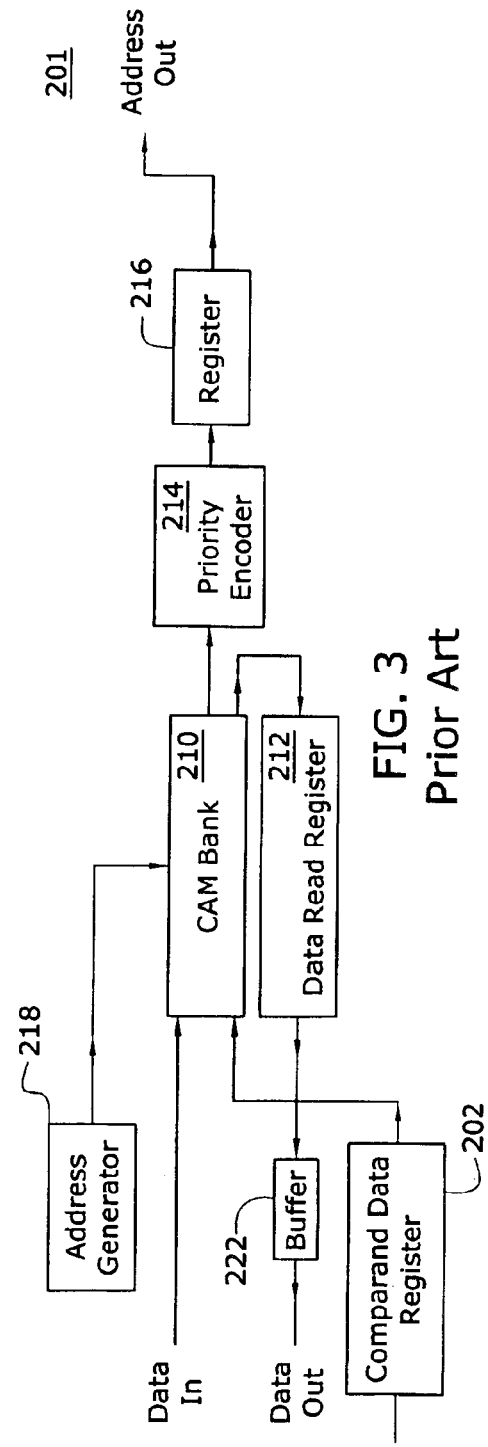
FIG. 3 is a schematic diagram of a CAM search circuit for use in a read operation in the prior art.
Figure 6:
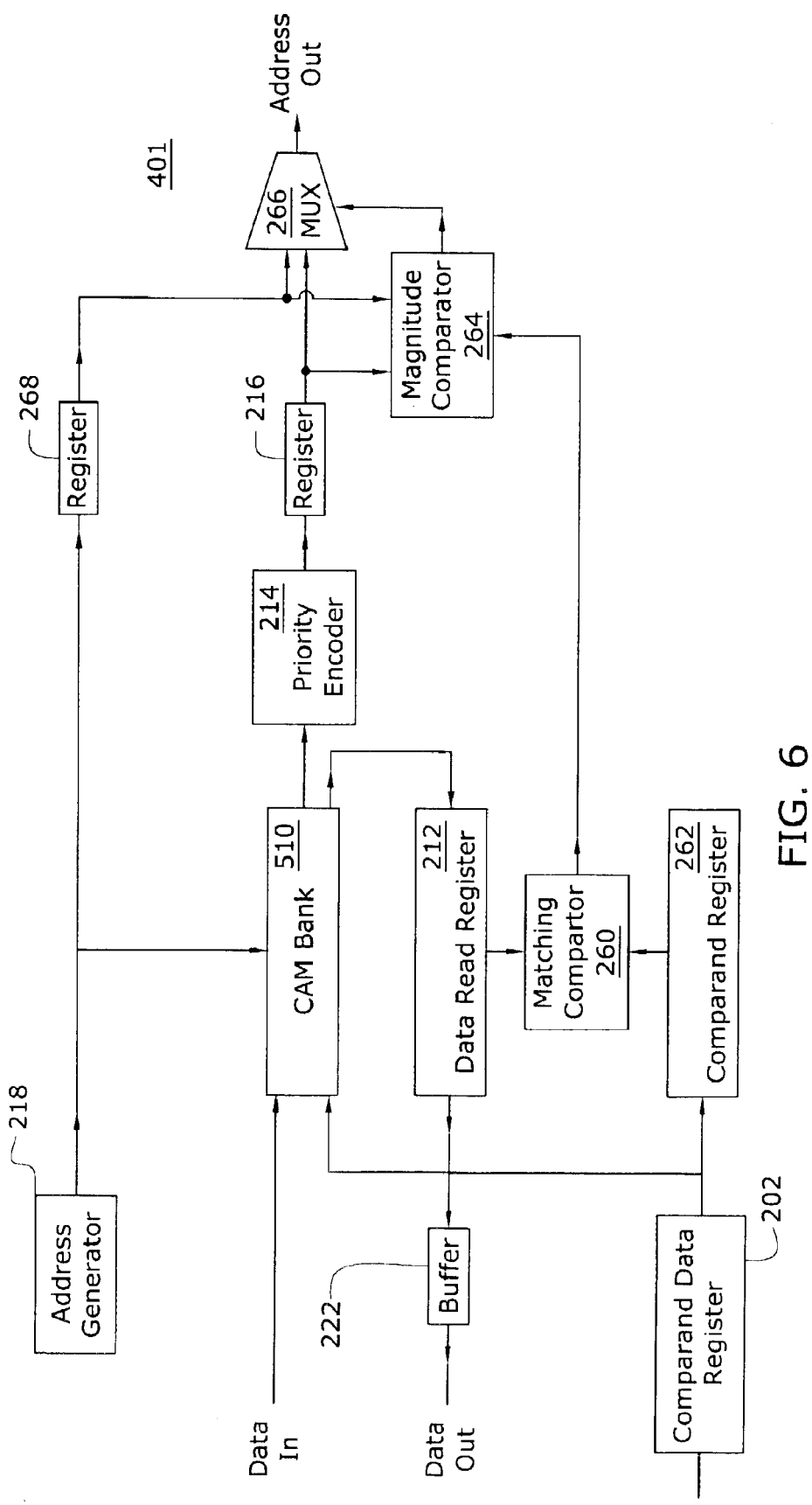
FIG. 6 is a schematic diagram of a CAM search circuit for use in a SRAM during a memory read operation in accordance with another exemplary embodiment of the invention.

In another embodiment of the present invention, a match search circuit 401 is provided that permits searching of a CAM bank 510 while isolating a match detection circuit 300 for a read access operation. FIG. 6 depicts a simplified schematic diagram of a CAM search circuit 401 which incorporates the match detection circuit 300 for use during a read memory access, in accordance with an exemplary embodiment of the invention. The configuration of the FIG. 6 search circuit 401 differs from the FIG. 3 match search circuit 201 in that the CAM bank 510 incorporates match detection circuits 300 in place of match detection circuits 100. The configuration of the FIG. 6 search circuit 401 also differs from that of the FIG. 3 search circuit 201 in that several additional circuits are present. Register 268 is included which is coupled to and disposed between the address generator 218 and a magnitude comparator 264. Register 268 holds the address of the CAM word being read from or written to a match detection circuit 300. Matching comparator 260 is coupled to and disposed between the data read register 212, the comparand register 262 and the magnitude comparator 264. Matching comparator 260 compares the data stored in the data read register 212 (e.g., the CAM word being read from or written to a match detection circuit 300) with the data stored in the comparand register 262 (e.g., the comparand) and indicates, by way of a logic state, the results of the comparison, e.g., a logic HIGH signal is emitted indicating true—that a match has occurred, and a logic LOW signal is emitted indicating false—that a match has not occurred.

A magnitude comparator 264 is coupled to and disposed in between the register 216, register 268, matching comparator 260 and the multiplexer 266. If a signal received from the matching comparator 260 indicates a match, the magnitude comparator 264 compares the priority of the address stored in register 216 to the address stored in register 268 and emits a signal to the multiplexer 266 indicating which of the two addresses should be output, e.g., which of the two addresses has the higher priority. If a signal received from the matching comparator 260 does not indicate a match, the magnitude comparator 264 emits a signal to the multiplexer 266 indicating that the multiplexer should output the address from the register 216.

During a read operation from a match detection circuit 300 using the match search circuit 401 the address of the word to be accessed is stored in register 268. Word select line 190 corresponding to the match detection circuit 300 containing the word to be written or read is enabled thereby pulling the match line 140 to VSS. The word is transferred from the match detection circuit 300 in the CAM bank 510 to the data read register 212. The comparand data word is stored in comparand register 262 and is also transferred to the CAM bank 510. Simultaneously while the word is being read from the match detection circuit 300, the search operation executes in the remainder of the match detection circuits 300 within the CAM bank 510. The priority encoder 214 determines the priority address of the matching word and stores that value in register 216.

The matching comparator 260 compares the data word in data read register 212 with the data in the comparand register 262 and if there is a match, then a signal is transmitted to the magnitude comparator 264 indicating that a match occurred. If signaled by the matching comparator 260 indicating a match, the magnitude comparator 264 then compares the address generated by the priority encoder 214 stored in register 216 with the read/write address stored in register 268 to determine the higher priority address. The magnitude comparator 264 then transmits a signal to multiplexor 266 indicating which address is the higher priority address. The multiplexer 266 transmits the address having the higher priority to a circuit downstream. Consequently, a read memory operation can be performed on a match search circuit 401, which incorporates match detection 300, without the match detection circuit 300 enabling a false signal indicating a match. Furthermore, the data from the match detection circuit 300 is compared to the comparand data 202, e.g., the data stored in the comparand register 262, to see if the data matches. If the data matches, then the magnitude comparator 264, performing in a similar manner as the priority encoder 214, prioritizes between the result of the previous prioritization stored in register 216 and the data stored in register 268. Search circuit 401 encompasses the search circuit 400 elements, consequently can also perform write operations analogous in operation to search circuit 400.

Figure 7:
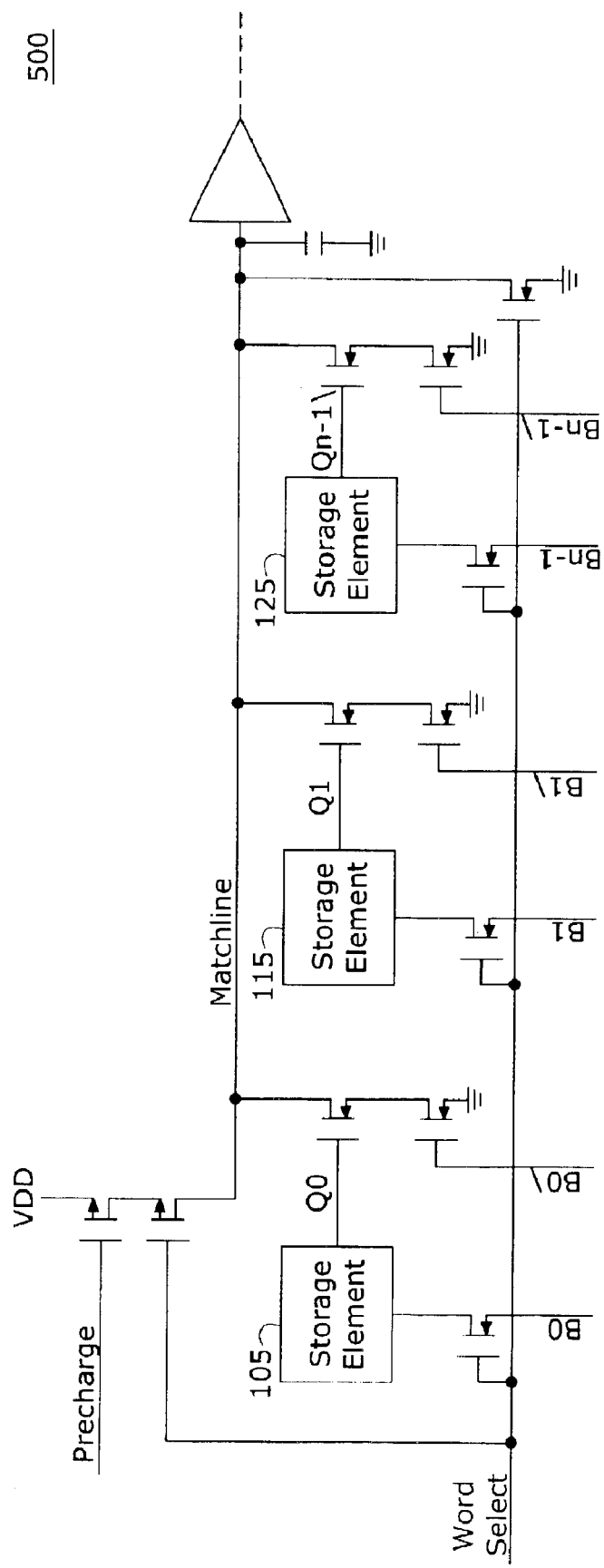
FIG. 7 is a schematic diagram of a CAM match detection circuit in a DRAM in accordance with an another exemplary embodiment of the invention.

Another exemplary embodiment of the invention is shown in FIG. 7 where the storage elements are dynamic storage elements. Searching CAMs while read or writing to a match detection circuit within a CAM bank is more critical where dynamic memory (e.g., DRAM) is used because of memory refreshing operations. The match detection circuit 500 of FIG. 7 is different from the match detection circuit 300 of FIG. 4 in two significant respects: first, dynamic storage elements 105, 115, and 125 are used in place of static storage elements 104, 114, and 124. Secondly, the dynamic storage elements 105, 115, and 125 only receive, store, and output a single value, whereas the storage elements 104, 114, and 124 receive, store, and output two values—a value and its complement. Therefore, match detection circuit 500 only compares the value stored in the storage element to the incoming bit. As with the FIG. 4 circuit, the configuration of the FIG. 7 match detection circuit 500 differs from that of the FIG. 1 match detection circuit 100 in several respects, one being that the second source/drain terminal of transistor 102 is coupled to the match line 140 through a p-type transistor 192. The gate of transistor 192 is coupled to the word select line 190. When the word select line 190 is enabled to read or write from the CAM detection circuit 500 (e.g., logic HIGH) the match line 140 is further isolated from the pre-charge voltage VDD. When the word select line 190 is not enabled (e.g., logic LOW) the match line 140 is coupled to the second source/drain gate of transistor 102 permitting the match line 140 to be coupled to the pre-charge voltage VDD.

Figure 8:
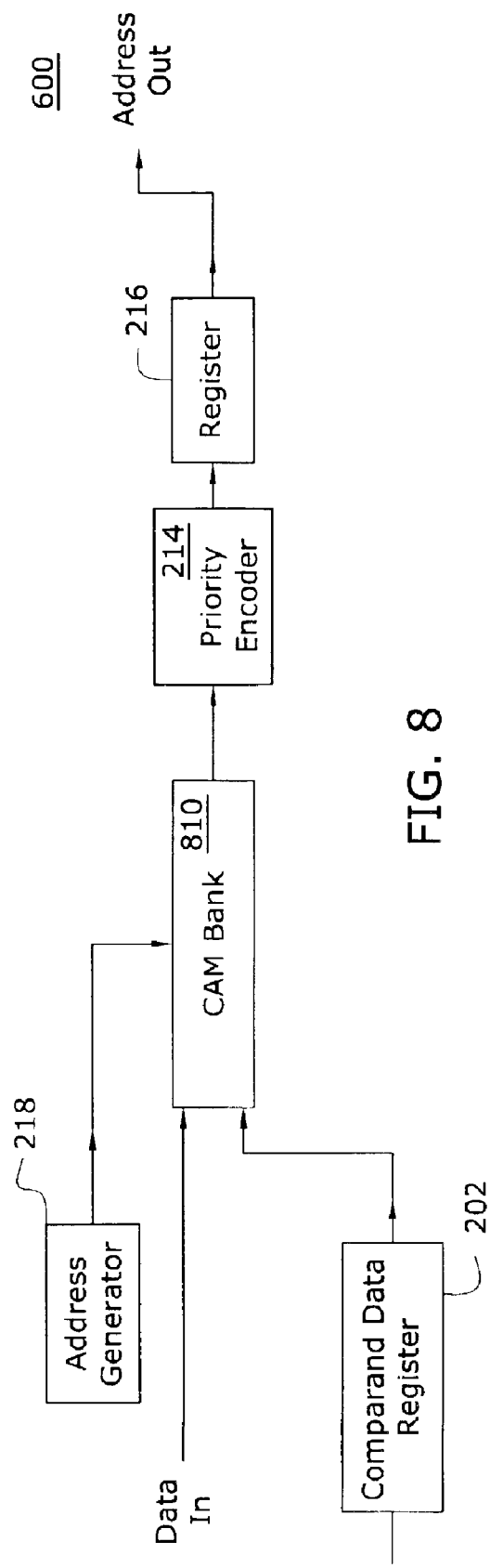
FIG. 8 is a schematic diagram of a CAM search circuit in a DRAM in accordance with an exemplary embodiment of the invention.

FIG. 8 depicts a simplified schematic diagram of a CAM search circuit 600 which incorporates the match detection circuit 500 for use during the implementation of a write operation to a match detection circuit 500 during a search of CAM search circuit 600, in accordance with an exemplary embodiment of the invention. The configuration of the FIG. 8 search circuit 600 differs from the FIG. 2 match search circuit 200 in that the CAM bank 810 incorporates match detection circuits 500 in place of match detection circuits 100.

Therefore, during a write operation using the match detection circuit 500, word select line 190 corresponding to the match detection circuit 500 to be written to is enabled thereby pulling the match line 140 to VSS. The word to be written to the match detection circuit 300 may then be transferred to the match detection circuit 500 in the CAM bank 810 without interrupting any search operation of the CAM bank 810. Furthermore, the search operation of the CAM bank 810 need not be delayed or incorporate any clock cycle offset to write to the match detection circuit 500 while the search is proceeding. By isolating the match detection circuit 500 and indicating a 'mismatch,' the match detection circuit 500 does not falsely enable a signal indicating a match.

Figure 9:
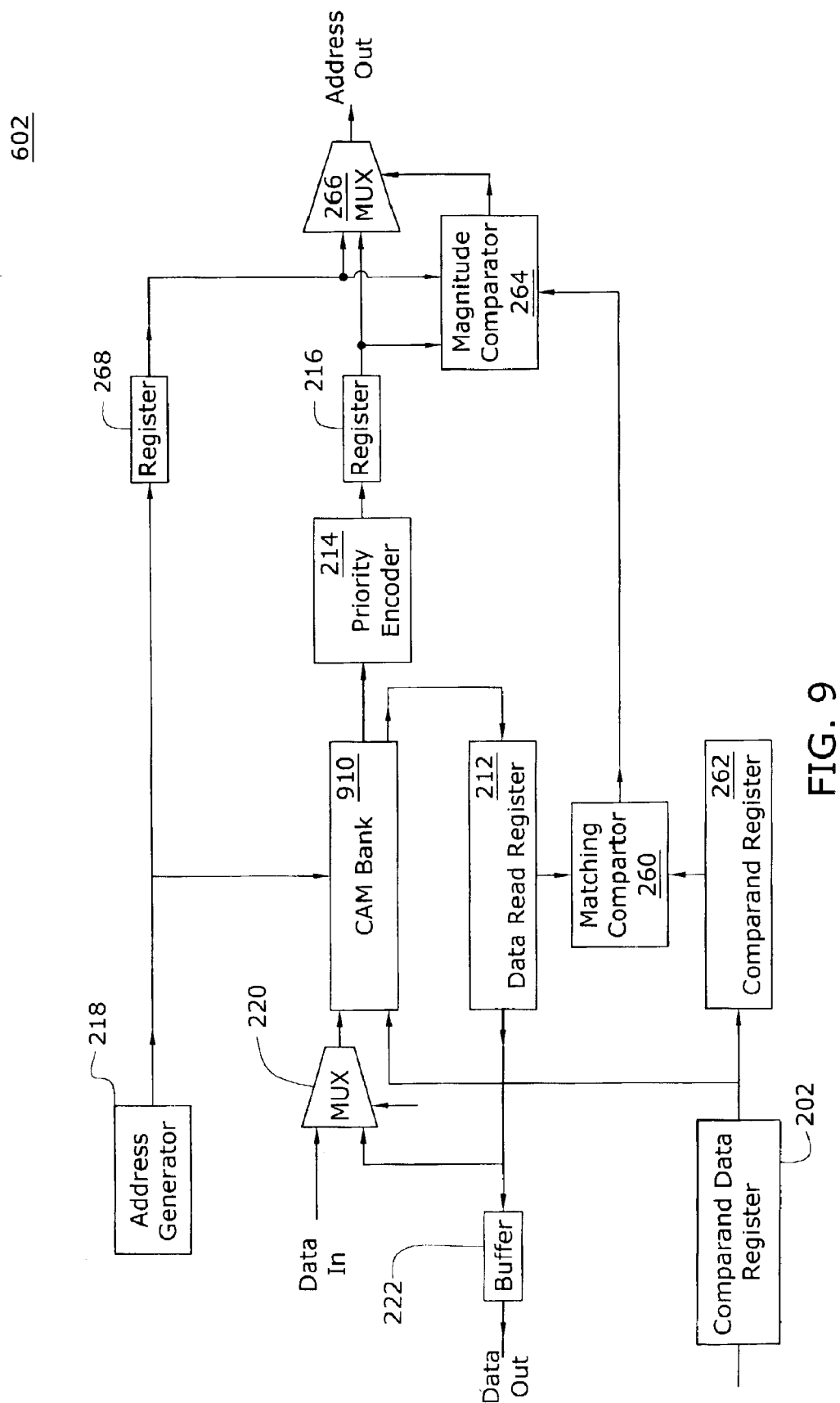
FIG. 9 is a schematic diagram of a CAM search circuit in a DRAM in accordance with an exemplary embodiment of the invention.

In another embodiment of the present invention, a match search circuit 601 is provided that permits searching of a CAM bank 910 while isolating a match detection circuit 500 for a read access operation. FIG. 9 depicts a simplified schematic diagram of a CAM search circuit 601, in accordance with another embodiment of the invention to be implemented with circuit 500. The configuration of the FIG. 9 search circuit 601 differs from the FIG. 3 search circuit 201 in that the CAM bank 910 incorporates match detection circuits 500 in place of match detection circuits 100. CAM search circuit 601 also differs from CAM search detection circuit 400 in the addition of coupling of data read register 212 to the CAM bank 910 through multiplexor 220. As shown in FIG. 9, this coupling permits the refreshing of dynamic storage elements 105, 115, and 125. For use during a refresh operation, a multiplexor 220 is also included which receives as its input data to be stored in the CAM bank 910. Multiplexor 220 also receives input from, and is coupled to, data read register 212. Outside circuitry (not shown) controls which input source multiplexor 220 supplies to the CAM bank 910.

During a write operation to CAM bank 910, multiplexor 220 selects the incoming data from the DATA IN line. During a refresh operation of a match detection circuit 500 within CAM bank 910, multiplexor 220 selects data input from data read register 212. Therefore, when a match detection circuit 500 within CAM bank 910 is selected for refreshing, the data stored in the match detection circuit 500 is supplied and stored in data read register 212. The data stored in data read register 212 is supplied to multiplexor 220 and multiplexer 220 selects data from data read register 212 to be supplied to CAM bank 910 which is supplied to the match detection circuit 500 selected for refreshing. Other than the refreshing of dynamic memory, operation of the search circuit 600 is analogous to the operation of search circuit 400 and operation of the search circuit 601 is analogous to the operation of search circuit 401.

Consequently, a read memory operation and a refresh memory operation can be performed on a match search circuit 601, which incorporates match detection 600, without the match detection circuit 600 enabling a false signal indicating a match. Search circuit 601 encompasses the search circuit 600 elements, consequently can also perform write operations analogous in operation to search circuit 600.

Figure 10:
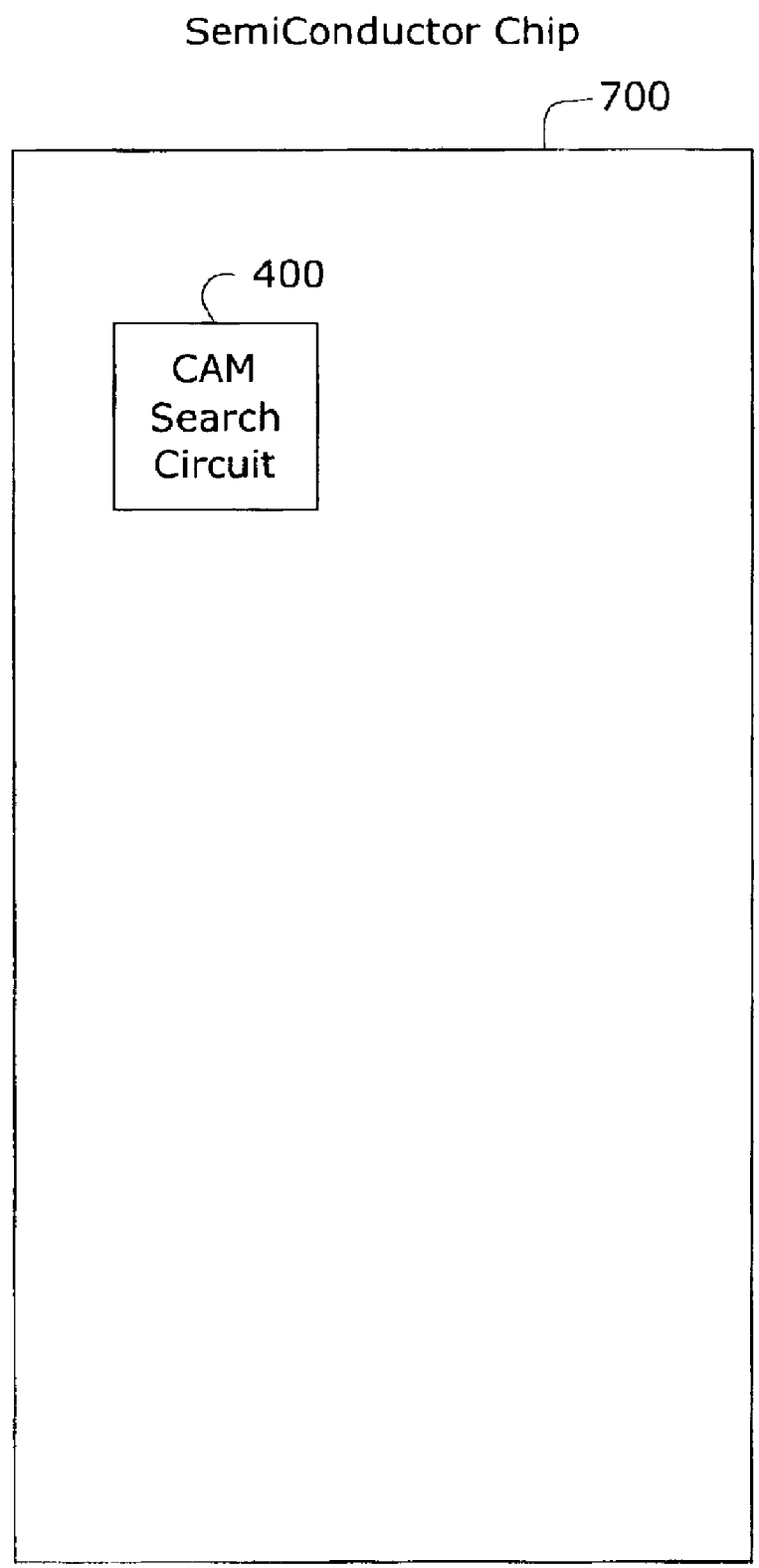
FIG. 10 is a schematic diagram of a processor system employing either the match detection circuit of FIG. 4 and the search circuit of either FIG. 5 or FIG. 6, or the match detection circuit of FIG. 7 and the search circuit of either FIG. 8 or FIG. 9, in accordance with another exemplary embodiment of the invention.

FIG. 10 depicts a CAM array employing a match search circuit 400, such as the one depicted in FIG. 5, included on a semiconductor memory chip 700 so that it may be incorporated into a router or other processor system. Although depicted with match search circuit 400, match detection circuit 401, 600, and 601 are also suitable.

Figure 11:
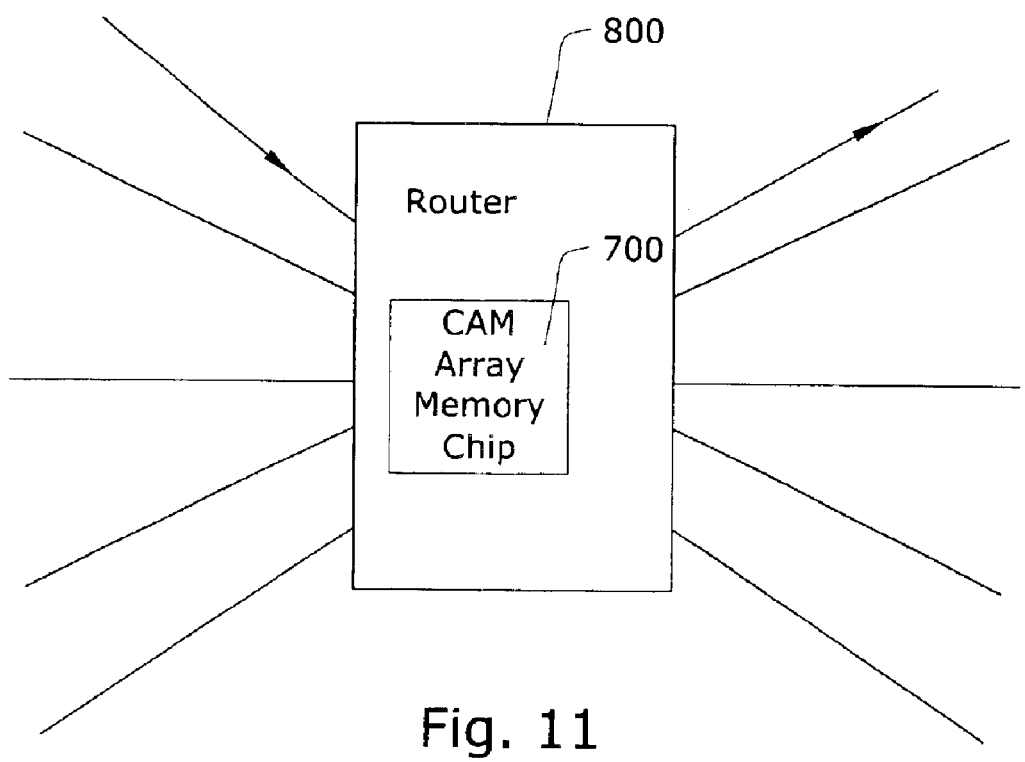
FIG. 11 is a schematic diagram of a router employing either the match detection circuit of FIG. 4 and the search circuit of either FIG. 5 or FIG. 6, or the match detection circuit of FIG. 7 and the search circuit of either FIG. 8 or FIG. 9, in accordance with another exemplary embodiment of the invention.

FIG. 11 is a simplified block diagram of a router 800 as may be used in a communications network, such as, e.g., part of the Internet backbone. The router 800 contains a plurality of input lines and a plurality of output lines. When data is transmitted from one location to another, it is sent in a form known as a packet. Oftentimes, prior to the packet reaching its final destination, that packet is first received by a router, or some other device. The router 800 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 800, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 11, router 800 contains the added benefit of employing a semiconductor memory chip 700 containing a CAM search circuit 400, such as that depicted in FIG. 10. Therefore, not only does the router benefit from having a CAM but also benefits by having a CAM with reduced power dissipation, in accordance with an exemplary embodiment of the invention. Although depicted with match search circuit 400, use of match search circuits 401, 600, and 601 are also suitable.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing different configurations of p-type and n-type transistors, the invention may be practiced with many other configurations without departing from the spirit and scope of the invention. Accordingly, the invention is not limited by the foregoing description or drawings, but is only limited by the scope of the appended claims.

What is claimed as new and desired to be protected by Letters Patent of the United States is:

1. A method of operating a content addressable memory (CAM), the method comprising:
   accessing a selected storage location of said CAM for a memory operation;
   disabling a match detection circuit associated with said selected storage location during said access operation;
   searching other storage locations of said CAM during said access operation by comparing the data stored in each of respective other storage locations to a stored word using respective enabled match detection circuits associated with said other storage locations;
   accessing data from said selected storage location; and
   comparing said accessed data to said stored word in a comparing circuit separate from said disabled match detection circuit.

2. The method of claim 1, wherein said disabling further comprises:
   isolating a match line of said disabled match detection circuit associated with said selected storage location from a pre-charge voltage.

3. The method of claim 2, wherein said disabling further comprises:
   placing said match line of said match detection circuit associated with said selected storage location in a logic state that indicates a mismatch.

4. The method of claim 3, wherein said searching further comprises:
   placing a match line of a respective enabled match detection circuit associated with each of said other storage locations in a logic state that indicates the result of said comparing.

5. The method of claim 4, further comprising:
   prioritizing said enabled match detection circuits with a respective match line having a logic state indicating a match.

6. The method of claim 5, further comprising:
   storing the result of said prioritizing.

7. The method of claim 5, wherein said prioritizing further comprises:
   ranking said enabled match detection circuits with a respective match line having a logic state indicating a match.

8. The method of claim 7, wherein said ranking further comprises:
   ordering said enabled match detection circuits with a respective match line having a logic state indicating a match.

9. The method of claim 8, wherein said ordering further comprises:
   choosing said first ordered enabled match detection circuit with a respective match line having a logic state indicating a match.

10. The method of claim 9, wherein said ordering further comprises:
    determining the address corresponding to each enabled match detection circuit with a respective match line having a logic state indicating a match.

11. The method of claim 10, wherein said choosing comprises selecting the enabled match detection circuit with a respective match line having a logic state indicating a match having the lowest address.

12. The method of claim 10, wherein said choosing comprises selecting the enabled match detection circuit with a respective match line having a logic state indicating a match having the highest address.

13. The method of claim 12, wherein searching further comprises:
enabling a signal that indicates the result of said comparing the enabled data from said selected storage location to said stored word.

14. The method of claim 13, where said signal reflects a logic state.

15. The method of claim 13, further comprising:
prioritizing said accessed data if said enabled signal indicates a match.

16. The method of claim 5, wherein said access operation is a read operation.

17. The method of claim 5, wherein said access operation is a write operation.

18. The method of claim 5, wherein said access operation is a refresh operation.

19. The method of claim 5, wherein said storage locations of said CAM are SRAM storage locations.

20. The method of claim 5, wherein said storage locations of said CAM are DRAM storage locations.

21. A method of operating a content addressable memory (CAM), the method comprising:
accessing a first storage location of said CAM for a memory operation;
disabling a match detection circuit associated with said first storage location during said access operation;
searching other storage locations associated with enabled match detection circuits of said CAM during said access operation;
prioritizing said other storage locations having a logic state indicating a match to a stored word;
accessing data from said first storage location; and
comparing said data to said stored word in a comparing circuit separate from said disabled match detection circuit.

22. The method of claim 21, further comprising:
generating the address corresponding to a priority storage location indicating a match.

23. The method of claim 22, wherein said priority is the highest priority.

24. The method of claim 22, wherein said priority is the lowest priority.

25. The method of claim 22, further comprising:
enabling a signal if said accessed data matches said stored word.

26. The method of claim 25, further comprising:
prioritizing the address associated with said accessed data with the result of said prior prioritizing if said signal is enabled.

27. The method of claim 21, wherein said memory access is a write operation.

28. The method of claim 26, wherein said memory access is a read operation.

29. The method of claim 26, wherein said memory access is a refresh operation.

30. The method of claim 27, wherein said CAM contains SRAM memory locations.

31. The method of claim 28, wherein said CAM contains SRAM memory locations.

32. The method of claim 27, wherein said CAM contains DRAM memory locations.

33. The method of claim 28, wherein said CAM contains DRAM memory locations.

34. The method of claim 29, wherein said CAM contains DRAM memory locations.

35. A content addressable memory (CAM), comprising:
a match detection circuit having a match line configured to be switchably coupled to a first voltage, where said first voltage represents a logic state indicating a mismatch, said match line configured to be coupled to said first voltage when a storage location associated with said match detection circuit is being accessed;
a secondary storage circuit for storing content from said match detection circuit if said match detection circuit is switchably coupled to said first voltage; and
a comparator for comparing said stored content to a stored word.

36. The content addressable memory of claim 35, wherein said match line of said match detection circuit is adapted to be switchably coupled to a second voltage, where said second voltage represents a logic state indicating a match.

37. The content addressable memory of claim 36, wherein said match detection circuit further comprises:
a first and second transistor, where said match line adapted to be switchably coupled to said first voltage through said first transistor, said match line being switchably coupled to said second voltage through said second transistor, said first transistor being on and said second transistor being off when a storage location associated with said match detection circuit is being accessed.

38. The content addressable memory of claim 36, further comprising:
a priority encoder coupled to receive the results of a search of said CAM, said priority encoder prioritizing the results of said search and outputting a result of said prioritization.

39. The content addressable memory of claim 38, further comprising:
a priority encoder storage location coupled to said priority encoder, said priority encoder storage location adapted to receive and store the results of said prioritization.

40. The content addressable memory of claim 39, further comprising:
an address generator coupled to said CAM, said address generator adapted to generate and output an address associated with a match detection circuit to said CAM.

41. The content addressable memory of claim 40, further comprising:
a data buffer coupled to said match detection storage location, said data buffer adapted to store data associated with said match detection storage location.

42. The content addressable memory of claim 40, further comprising:
a matching comparator coupled between said match detection storage location and a comparand storage location, said matching comparator adapted to compare the data associated with said match detection storage location and said comparand storage location and outputting a signal indicating the result of said comparison.

43. The content addressable memory of claim 42, further comprising:

an address generator storage location coupled to said address generator for storing address data associated with said match detection circuit.

44. The content addressable memory of claim 43, further comprising:
a magnitude comparator coupled to said address generator storage location, said priority encoder storage location, and said matching comparator, said magnitude comparator adapted to receive data from said address generator storage location and said priority encoder storage location, prioritize said data, and output a signal indicating the results of said prioritizing.

45. The content addressable memory of claim 44, further comprising:
a data output multiplexor coupled to said address generator storage location, said priority encoder storage location, and said magnitude comparator, said data output multiplex comparator adapted to output either said data received from said address generator storage location or said priority encoder storage location depending on said signal output by said magnitude comparator.

46. The content addressable memory of claim 45, further comprising:
a data input multiplexor coupled to said match detection storage location and adapted to receive a first data and a data input control signal, said data input multiplexor adapted to output to said CAM either said data received from said match detection storage location or said first data depending on said data input control signal.

47. The content addressable memory of claim 36, wherein said memory access operation is a write operation.

48. The content addressable memory of claim 45, wherein said memory access operation is a read operation.

49. The content addressable memory of claim 46, wherein said memory access operation is a refresh operation.

50. The content addressable memory of claim 47, wherein said CAM contains dynamic memory (DRAM).

51. The content addressable memory of claim 48, wherein said CAM contains dynamic memory (DRAM).

52. The content addressable memory of claim 47, wherein said CAM contains static memory (SRAM).

53. The content addressable memory of claim 48, wherein said CAM contains static memory (SRAM).

54. The content addressable memory of claim 49, wherein said CAM contains dynamic memory (DRAM).

55. A semiconductor memory chip, comprising:
a content addressable memory (CAM), comprising:
a match detection circuit having a match line configured to be switchably coupled to a first voltage, where said first voltage represents a logic state indicating a mismatch, said match line configured to be coupled to said first voltage when a storage location associated with said match detection circuit is being accessed;
a secondary storage circuit for storing content from said match detection circuit if said match detection circuit is switchably coupled to said first voltage; and
a comparator for comparing said stored content to a stored word.

56. The semiconductor memory chip of claim 55, wherein said match line of said match detection circuit is adapted to be switchably coupled to a second voltage, where said second voltage represents a logic state indicating a match.

57. The semiconductor memory chip of claim 56, wherein said match detection circuit further comprises:
a first and second transistor, where said match line adapted to be switchably coupled to said first voltage through said first transistor, said match line adapted to be switchably coupled to said second voltage through said second transistor, said first transistor being on and said second transistor being off when a storage location associated with said match detection circuit is being accessed.

58. The semiconductor memory chip of claim 56, further comprising:
a priority encoder coupled to receive the results of a search of said CAM, said priority encoder adapted to prioritize the results of said search and output a result of said prioritization.

59. The semiconductor memory chip of claim 58, further comprising:
a priority encoder storage location coupled to said priority encoder, said priority encoder storage location adapted to receive and store the results of said prioritization.

60. The semiconductor memory chip of claim 59, further comprising:
an address generator coupled to said CAM, said address generator adapted to generate and output an address associated with a match detection circuit to said CAM.

61. The semiconductor memory chip of claim 60, further comprising:
a data buffer coupled to said match detection storage location, said data buffer adapted to store data associated with said match detection storage location.

62. The semiconductor memory chip of claim 60, further comprising:
a matching comparator coupled between said match detection storage location and a comparand storage location, said matching comparator adapted to compare the data associated with said match detection storage location and said comparand storage location and adapted to output a signal indicating the result of said comparison.

63. The semiconductor memory chip of claim 62, further comprising:
an address generator storage location coupled to said address generator for storing address data associated with said match detection circuit.

64. The semiconductor memory chip of claim 63, further comprising:
a magnitude comparator coupled to said address generator storage location, said priority encoder storage location, and said matching comparator, said magnitude comparator adapted to receive data from said address generator storage location and said priority encoder storage locations prioritize said data, and adapted to output a signal indicating the results of said prioritizing.

65. The semiconductor memory chip of claim 64, further comprising:
a data output multiplexor coupled to said address generator storage location, said priority encoder storage location, and said magnitude comparator, said data output multiplex comparator adapted to output either said data received from said address generator storage location or said priority encoder storage location depending on said signal output by said magnitude comparator.

66. The semiconductor memory chip of claim 65, further comprising:
a data input multiplexor coupled to said match detection storage location and adapted to receive a first data and a data input control signal, said data input multiplexor adapted to be output to said CAM either said data received from said match detection storage location or said first data depending on said data input control signal.

67. The semiconductor memory chip of claim 56, wherein said memory access operation is a write operation.

68. The semiconductor memory chip of claim 65, wherein said memory access operation is a read operation.

69. The semiconductor memory chip of claim 66, wherein said memory access operation is a refresh operation.

70. The semiconductor memory chip of claim 67, wherein said CAM contains dynamic memory (DRAM).

71. The semiconductor memory chip of claim 68, wherein said CAM contains dynamic memory (DRAM).

72. The semiconductor memory chip of claim 67, wherein said CAM contains static memory (SRAM).

73. The semiconductor memory chip of claim 68, wherein said CAM contains static memory (SRAM).

74. The semiconductor memory chip of claim 69, wherein said CAM contains dynamic memory (DRAM).

75. A router, comprising:
a content addressable memory (CAM), comprising:
a match detection circuit having a match line configured to be switchably coupled to a first voltage, where said first voltage represents a logic state indicating a mismatch, said match line configured to be coupled to said first voltage when a storage location associated with said match detection circuit is being accessed;
a secondary storage circuit for storing content from said match detection circuit if said match detection circuit is switchably coupled to said first voltage; and
a comparator for comparing said stored content to a stored word.

76. The router of claim 75, wherein said match line of said match detection circuit is adapted to be switchably coupled to a second voltage, where said second voltage represents a logic state indicating a match.

77. The router of claim 76, wherein said match detection circuit further comprises:
a first and second transistor, where said match line adapted to be switchably coupled to said first voltage through said first transistor, said match line adapted to be switchably coupled to said second voltage through said second transistor, said first transistor adapted to be on and said second transistor being off when a storage location associated with said match detection circuit is being accessed.

78. The router of claim 75, further comprising:
a priority encoder coupled to receive the results of a search of said CAM, said priority encoder adapted to prioritize the results of said search and output a result of said prioritization.

79. The router of claim 78, further comprising:
a priority encoder storage location coupled to said priority encoder, said priority encoder storage location adapted to receive and store the results of said prioritization.

80. The router of claim 79, further comprising:
an address generator coupled to said CAM, said address generator adapted to generate and output an address associated with a match detection circuit to said CAM.

81. The router of claim 80, further comprising:
a data buffer coupled to said match detection storage location, said data buffer adapted to store data associated with said match detection storage location.

82. The router of claim 80, further comprising:
a matching comparator coupled between said match detection storage location and a comparand storage location, said matching comparator adapted to compare the data associated with said match detection storage location and said comparand storage location and output a signal indicating the result of said comparison.

83. The router of claim 82, further comprising:
an address generator storage location coupled to said address generator for storing address data associated with said match detection circuit.

84. The router of claim 83, further comprising:
a magnitude comparator coupled to said address generator storage location, said priority encoder storage location, and said marching comparator, said magnitude comparator adapted to receive data from said address generator storage location and said priority encoder storage location, prioritize said data, and output a signal indicating the results of said prioritizing.

85. The router of claim 84, further comprising:
a data output multiplexor coupled to said address generator storage location, said priority encoder storage location, and said magnitude comparator, said data output multiplex comparator adapted to output either said data received from said address generator storage location or said priority encoder storage location depending on said signal output by said magnitude comparator.

86. The router of claim 85, further comprising:
a data input multiplexor coupled to said match detection storage location and adapted to receive a first data and a data input control signal, said data input multiplexor adapted to output to said CAM either said data received from said match detection storage location or said first data depending on said data input control signal.

87. The router of claim 76, wherein said memory access operation is a write operation.

88. The router of claim 85, wherein said memory access operation is a read operation.

89. The router of claim 86, wherein said memory access operation is a refresh operation.

90. The router of claim 87, wherein said CAM contains dynamic memory (DRAM).

91. The router of claim 88, wherein said CAM contains dynamic memory (DRAM).

92. The router of claim 87, wherein said CAM contains static memory (SRAM).

93. The router of claim 88, wherein said CAM contains static memory (SRAM).

94. The router of claim 89, wherein said CAM contains dynamic memory (DRAM).

* * * * *